United States Patent [19]

Scheib

[11] 4,439,818
[45] Mar. 27, 1984

[54] FLEXIBLE LIGHT DISPLAY WITH EVENLY DISTRIBUTED ILLUMINATION

[76] Inventor: Joseph J. Scheib, 4453 Pali Way, Boulder, Colo. 80301

[21] Appl. No.: 469,705

[22] Filed: Feb. 25, 1983

[51] Int. Cl.³ ............................................. F21V 21/14
[52] U.S. Cl. .................................. 362/250; 362/221; 362/226; 362/252; 362/287; 362/382; 362/418; 362/419; 362/800
[58] Field of Search ............... 362/226, 221, 250, 252, 362/287, 382, 418, 419, 800

[56] References Cited

U.S. PATENT DOCUMENTS 3,037,137  5/1962  Motson ........................... 362/320 X
3,894,225  7/1975  Chao ................................ 362/249
4,107,767  8/1978  Anquetin ...................... 362/320 X
4,173,035  10/1979  Hoyt ............................. 362/812 X
4,177,503  12/1979  Anquetin ...................... 362/320 X Primary Examiner—Stephen J. Lechert, Jr.
Attorney, Agent, or Firm—O'Rourke & Harris

[57] ABSTRACT

A flexible electric lighting strip is disclosed that can be utilized in various lengths, is capable of three dimensional movement, and provides evenly distributed illumination. The lighting strip is formed by an adhesive tape having a plurality of light emitting diodes thereon connected in parallel with each other with each light emitting diode being connected in series with a resistor also mounted on the tape.

15 Claims, 3 Drawing Figures

FLEXIBLE LIGHT DISPLAY WITH EVENLY DISTRIBUTED ILLUMINATION

FIELD OF THE INVENTION

This invention relates to a lighting strip and, more particularly, relates to a flexible lighting strip providing uniform intensity.

BACKGROUND OF THE INVENTION

Lighting strips have heretofore been suggested for use in diverse manners, including decorative purposes (see, for example, U.S. Pat. No. 3,500,036). In addition, flexible electric lighting strips have also heretofore been suggested (see, for example, U.S. Pat. Nos. 3,894,225, 4,107,767 and 4,173,035).

However, heretofore suggested flexible lighting strips have, at least in some instances, been limited as to flexibility so that the lighting strip could not be satisfactorily utilized in forming letters and/or numbers.

When heretofore known lighting strips have been used in illuminating decorative patterns, letterings or drawings, a further problem has also heretofore been encountered in providing even, or uniform, illumination, particularly where portions of the intended display needed a greater number of lights (consider, for example, an "8" as opposed to a "1") due to the larger area that needed to be illuminated. Heretofore, this has resulted, at least in some instances, in reduced illumination intensity and/or in some letters and/or numbers appearing brighter than others in the illuminated display.

SUMMARY OF THE INVENTION

The present invention provides an improved lighting strip that has enhanced flexing capability so as to be useful in forming characters and is capable of providing uniform illumination regardless of the characters selected for display. In the particular embodiment shown, a flexible multi-layered pressure sensitive adhesive tape, having a plurality of triangular sections on each side of the tape removed, provides a base, or carrier, upon which is mounted a plurality of light emitting diodes (LEDs) connected in parallel with each other with each LED having a resistor, likewise mounted on the tape, connected in series therewith.

It is therefore an object of this invention to provide an improved lighting strip.

It is another object of this invention to provide a lighting strip having improved flexing capabilities.

It is another object of this invention to provide an improved lighting strip having uniform illumination.

It is still another object of this invention to provide a method for forming a light display having diverse characters of uniform illumination.

With these and other objects in view, which will become apparent to one skilled in the art as the description proceeds, this invention resides in the novel construction, combination, arrangement of parts and method substantially as hereinafter described and more particularly defined by the appended claims, it being understood that such changes in the precise embodiment of the herein disclosed invention were meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which.

DESCRIPTION OF THE INVENTION

Figure 1:
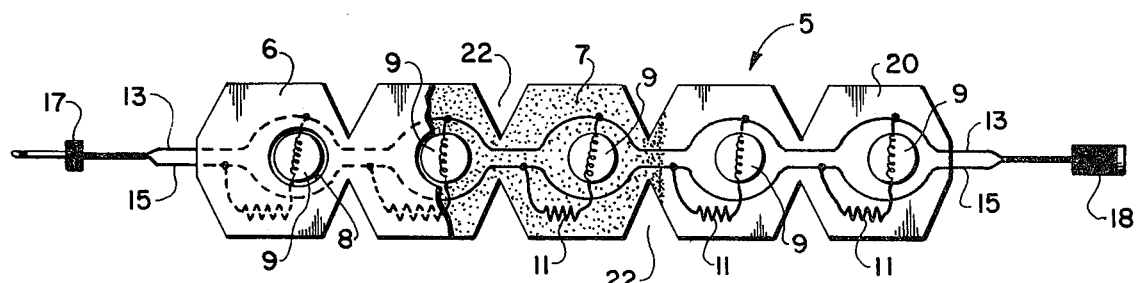
FIG. 1 is a front partially cut-away view of a length of flexible lighting tape of this invention.
Figure 2:
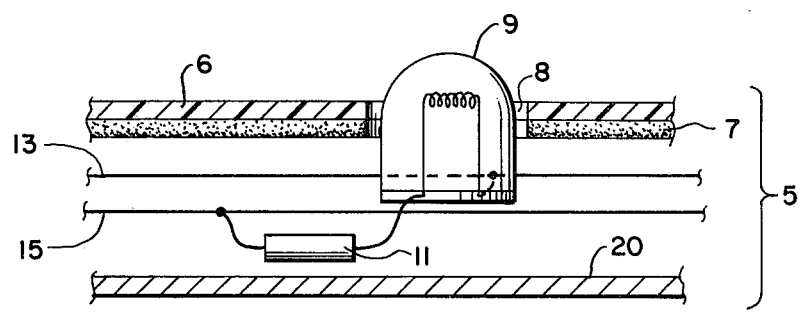
FIG. 2 is an explosive side view illustrating the tape shown in FIG. 1.

As shown in FIG. 1, lighting strip 5 of this invention includes a multi-layered, pressure sensitive tape 6 at least the rear side of which has an adhesive 7 thereon. A series of apertures 8 are also provided in the tape as shown in FIGS. 1 and 2. A plurality of light emitting diodes 9 (each of which, as shown in FIG. 1, is depicted by symbol and shown connected in series with a resistor 11 (also depicted by symbol in FIG. 1) that is preferably a 330 ohm ¼ watt resistor) are connected in parallel with each other by wires 13 and 15. Resistors 11 allow use of a great number of lighting element without causing dimming and achieves uniform lighting intensity even when utilized with a low voltage power source (such as, for example 9 volts).

A male plug 17 is electrically attached to wires 13 and 15 at one end of the tape, while a female receiver 18 is electrically attached to wires 13 and 15 at the other end of the tape. While not specifically shown, male and female plugs 17-18 can be two prong elements if desired.

As best shown in FIG. 1, all of the electrical circuitry is preferably mounted on the adhesive 7 so as to be maintained in position by the adhesive. As best shown in FIG. 2, when the electrical circuitry is mounted adjacent to tape 6 (i.e., in engagement with adhesive 7 at the rear side of tape 6), LEDs 9 protrude through the apertures 8 in the tape so as to be visible from the front side of the tape. As also shown in FIG. 2, a bottom cover 20 may also be provided to cover the electrical circuitry. Bottom cover 20 may also be held in position by engagement with adhesive 7.

The flexibility of tape 6 is improved by the removal of triangular sections 22 at selected points along the length of the tape as best shown in FIG. 1. The apexes of the triangular sections are oriented towards the centerline of the tape. Flexibility of the tape can be varied by varying the spacing and sizes of the removed triangular sections.

The lighting strip 5 of this invention may be utilized in providing uniform illumination to a great number of lighting elements and hence a variety of characters. In addition, shaping of the characters is enhanced since the strip can be flexed in all three dimensions to provide any shape desired.

Figure 3:
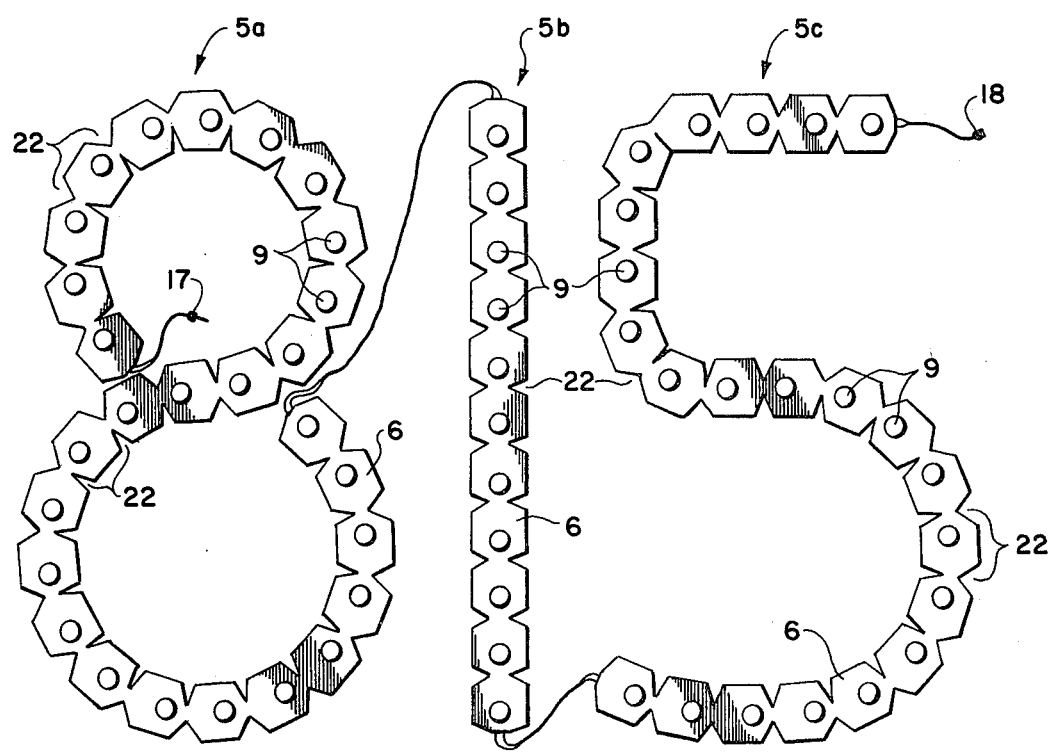
FIG. 3 is a front view illustrating the tape shown in FIGS. 1 and 2 formed into a sequence of numerals to provide a display depicting a house number by way of example.

Different lengths of the lighting strip are preferably utilized to provide different characters and can provide, for example, an illuminated house number as shown by way of example in FIG. 3, where three lighting strips (designated as 5a, 5b, and 5c) are utilized to form the numeral sequence 815. It is important to note that even though the illuminated areas require many lighting elements to form different numbers (the numeral "1", for example, requires considerably fewer lights than does the numeral "8" or even the numeral "5"), the illuminated number (815 as illustrated in FIG. 3) will nevertheless be of uniform brilliance (even though a relatively low voltage is utilized to power the lighting strip)

due to the circuitry provided for the lighting strip of this invention.

In a working embodiment of this invention, flexible tape 6 was approximately ½ inches in width with the LEDs spaced approximately ¾ inches apart. A plurality of lengths of tape were connected together using the male and female sockets (and, where needed, by extention cords having like male and female sockets). For safety purposes, the circuitry preferably terminates at a female socket member. A supply transformer of nine volts (not shown) provides a low voltage power source which also provides a safety factor with the female receiver being preferably connected to the transformer. The use of the transformer also provides a low voltage drain for cost effectiveness (a nine volt battery could if desired, be used as the power source along with a DC to AC converter to supply a 9 volt AC input to the circuitry).

As can be appreciated from the foregoing, this invention provides an improved lighting strip having enhanced flexibility and uniform illumination.

What is claimed is:

1. A lighting strip, comprising:
   power means for providing a low voltage power source of less than 110 volts;
   a plurality of lighting means;
   a plurality of resistors each of which is connected in series with a different one of said plurality of lighting means;
   electrical means connecting each of said series connected lighting means and resistance means with said power means; and
   carrier means for having said plurality of lighting means mounted thereon for allowing said plurality of lighting means to be configured in a predetermined manner.

2. The lighting strip of claim 1 wherein said plurality of lighting means are light emitting diodes.

3. The lighting strip of claim 1 wherein said plurality of resistance means are 330 ohm resistors.

4. The lighting strip of claim 1 wherein said electrical means includes male and female socket means to permit additional lighting means and resistance means to be added.

5. The lighting strip of claim 4 wherein said electrical means includes extention means having male and female socket means for connecting said additional lighting means and resistance means to said plurality of lighting means and resistance means.

6. The lighting strip of claim 1 wherein said carrier means is adhesive tape having said plurality of lighting means and resistance means mounted thereon.

7. The lighting strip of claim 1 wherein said carrier means has portions removed to facilitate configuring of said lighting means.

8. The lighting strip of claim 1 wherein said carrier means is adhesive tape having triangular portions removed therefrom.

9. A flexible electrical lighting strip, comprising:
   a plurality of light emitting diodes and a plurality of resistors, said light emitting diodes being electrically connected in parallel with respect to each other with each said light emitting diode having one of said resistors electrically connected in series therewith;
   a male plug electrically connected at one end of said parallel connected light emitting diodes and a female receiver electrically connected to the other end of said parallel connected light emitting diodes; and
   a carrier having an adhesive at one side thereof for engagement with said light emitting diodes and said resistors for positioning the same, said carrier being configured to provide three dimensional movement to allow said carrier to be shaped into a predetermined pattern for an illuminated display by said light emitting diodes.

10. The flexible electrical lighting strip of claim 9 wherein said resistors are 330 ohm ¼ watt resistors.

11. The flexible electrical lighting strip of claim 9 wherein said carrier includes triangular section notches with the triangular apex of each said notch being toward the interior of the carrier at each side of the carrier with said notches being spaced at preselected distances along the length of the carrier.

12. The flexible electrical lighting strip of claim 9 wherein said carrier is about ½ inches in width and wherein said light emitting diodes are spaced approximately ¾ inches apart.

13. A method for providing an illuminated display of uniform intensity, said method comprising:
   providing flexible lighting strips, each of which includes a plurality of series connected lighting means and resistance means with each of said series connected lighting means and resistance means being connected in parallel with one another;
   selecting a first flexible lighting strip having a predetermined number of lighting means thereon and configuring the same into a preselected first character;
   selecting a second flexible lighting strip having a different predetermined number of lighting means thereon and configuring the same into a preselected second character; and
   connecting said lighting means of said first and second characters to provide a lighting display of uniform intensity.

14. The method of claim 13 wherein said method includes connecting said first and second characters to a low voltage power supply.

15. The method of claim 13 wherein said method includes selecting a number of characters to provide a house number.

* * * * *